(12) United States Patent
Baginski et al.

(10) Patent No.: US 7,423,573 B2
(45) Date of Patent: Sep. 9, 2008

(54) ARCHITECTURE COMBINING A CONTINUOUS-TIME STAGE WITH A SWITCHED-CAPACITOR STAGE FOR DIGITAL-TO-ANALOG CONVERTERS AND LOW-PASS FILTERS

(75) Inventors: Paul A. Baginski, Methuen, MA (US);
Robert Adams, Acton, MA (US);
Khiem Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/616,468

(22) Filed: Dec. 27, 2006

(65) Prior Publication Data
US 2007/0159370 A1  Jul. 12, 2007

Related U.S. Application Data

(60) Provisional application No. 60/754,405, filed on Dec. 28, 2005.

(51) Int. Cl.
*H03M 1/66* (2006.01)
(52) U.S. Cl. .................... 341/150; 341/144; 341/172; 341/143
(58) Field of Classification Search ............ 341/144, 341/150, 143, 172
See application file for complete search history.

(56) References Cited

U.S. PATENT DOCUMENTS

| 5,072,219 A | * | 12/1991 | Boutaud et al. | 341/150 |
| 5,245,344 A | * | 9/1993 | Sooch | 341/150 |
| 5,451,950 A | * | 9/1995 | Vincelette et al. | 341/150 |
| 5,920,273 A | * | 7/1999 | Hirano | 341/144 |
| 6,118,399 A | * | 9/2000 | Krone | 341/150 |
| 6,522,277 B2 | * | 2/2003 | Fujimori et al. | 341/144 |
| 6,803,869 B1 | * | 10/2004 | Melanson et al. | 341/143 |
| 6,861,968 B2 | * | 3/2005 | Melanson et al. | 341/143 |
| 2005/0073453 A1 | * | 4/2005 | Cheng et al. | 341/154 |

OTHER PUBLICATIONS

Adams et al., "A 113-dB SNR Oversampling DAC with Segmented Noise-Shpaed Scrambling" IEEE Journal of solid-State Circuits, vol. 33, No. 12, Dec. 1998, pp. 1871-1878.
Quiting et al., "Use of Oversampled Modulator for Analogue Adaptive FIR Filters Based on LMS Algorithm" Electronics Letters, XP-002437462, Apr. 9, 1992, vol. 28, No. 8, pp. 751-753.
Su et al., "A CMOS Oversampling D/A Converter with a Current-Mode Semidigital Reconstruction Filter" 8107 IEEE Journal of Solid-State Circuits, Dec. 28, 1993, No. 12, New York, pp. 1224-1233.

* cited by examiner

*Primary Examiner*—Jean B Jeanglaude
(74) *Attorney, Agent, or Firm*—Gauthier & Connors LLP

(57) ABSTRACT

A digital to analog converter (DAC) includes a first continuous-time stage that receives an input signal associated with a digital signal and performs continuous-time digital-to-analog conversion operations on the input signal. The first continuous-time stage outputs a first output signal. A second switched-capacitor stage receives the first output signal and performs switched-capacitor filtering of the first output signal. The second switched-capacitor stage outputs a second output signal that is sent to a low pass filter to form a continuous analog signal associated with the digital signal.

15 Claims, 5 Drawing Sheets

ARCHITECTURE COMBINING A CONTINUOUS-TIME STAGE WITH A SWITCHED-CAPACITOR STAGE FOR DIGITAL-TO-ANALOG CONVERTERS AND LOW-PASS FILTERS

PRIORITY INFORMATION

This application claims priority from provisional application Ser. No. 60/754,405 filed Dec. 28, 2005, which is incorporated herein by reference in its entirety.

BACKGROUND OF THE INVENTION

The invention relates to the field of digital-to-analog converters (DAC), and in particular to combining a continuous-time stage with a switched-capacitor stage for digital-to-analog converters (DACs) and low-pass filters.

Audio signals are increasingly stored as digital audio signals on CDs, computer hard-drives and portable music players such as MP3 devices. The stored digital signals are typically stored as a series of digital word samples of the original analog sound. Such digital audio signals need to be converted into corresponding analog signals for application to audio transducers such as loudspeakers and earphones, and often amplification, mixing, switching, or filtering stages as well.

Various methods of achieving this conversion while maintaining low distortion and other desirable characteristics are known. FIG. 1A illustrates an approach where the digital N-bit sampled signal from a digital source 1 such as a CD player in put directly to a N-bit DAC 2 comprising a resistor network. This gives an intermediate analog signal quantized to $2^N$ voltage levels and sample-and-held at the audio sample rate; which signal is then passed through a low-pass filter 3a to give a smoothed analog waveform. Since the audio sample rate is typically only 44.1 kHz or 48 kHz a fast roll-off filter 3a is required to pass signals at 20 kHz but attenuate signals at say 44.1 kHz–20 kHz=24 kHz in order to avoid aliasing effects. Also the DAC 2 needs to have the full resolution of the digital word, so to get say—100 dB distortion, one needs a DAC 2 linear to better than 16 bits, which is difficult and expensive and power-hungry. However, for lower-performance applications, say, telephony, this technique may be appropriate. As noted, the DAC may comprise a resistor string and selection switches as drawn, or alternatively, an array of selectable parallel current sources, or switched capacitor circuitry as is known.

FIG. 1B illustrates an alternative scheme. The N-bit digital word from the digital source 1 is input to a digital delta-sigma modulator 4, which outputs a single-bit digital stream, at a much higher sample rate, for example 6 MHz. The quantization noise introduced is spectrally shaped to move it out of the audio band. The DAC 4 now need only be a simple 1-bit DAC, essentially a switch between two voltage levels. Its two-level output then requires filtering, but the anti-aliasing requirements are much more relaxed given the higher sample rate, and so a simpler, cheaper filter 3b can be implemented. In implementations the DAC switches may drive voltages into resistors of the following filters, or control the switching of capacitors in switched-capacitor filters, or may control current sources feeding into following filters.

FIG. 1C illustrates a further alternative, in which a multibit (n-bit) delta-sigma converter 6 is used. The multi-bit output has less in-band quantization noise than the single-bit implementation, allowing better performance for a given clock frequency, and is also less sensitive to clock jitter than a 1-bit scheme. A resistor network DAC 7 can be used as shown to generate an n-bit sampled analog intermediate signal, though in practical implementations switched-capacitor or switched-current circuitry may be used. The intermediate waveform, prior to the smoothing filter 3c, has less out-of-band quantization noise so further easing the requirements on this filter. Because of the higher sample rate, known techniques such as dynamic-element matching can be used to move distortion components due to mismatch of component elements of the n-bit DAC 7 out of the audio band.

The term "delta-sigma", as used here in "delta-sigma modulator" or "delta-sigma converter" or "delta-sigma bit stream" for instance, are taken here to encompass any similar scheme, such as "noise shapers", which take a lower-sample-rate wide-bit-width data input data stream and output a high-sample-rate small-bit-width data stream, usually but not necessarily shaping the spectrum of the resulting extra quantization noise so that it falls outside the signal band of interest.

In each of the above systems there is a need for a DAC (2, 4, 6), either single bit or multi-bit, and also a need for a filter (3a, 3b, 3c) for smoothing of the output waveform. Typically today the DAC and filter are implemented using CMOS integrated circuit technology. The DAC and filter may be implemented using switched-capacitor techniques, although the some or all of the filtering may be implemented just using a CMOS op amp and passive resistors and capacitors, on-chip or off-chip.

SUMMARY OF THE INVENTION

According to one aspect of the invention, there is provided a digital to analog converter (DAC). The DAC includes a first continuous-time stage that receives an input signal associated with a digital signal and performs continuous-time digital-to-analog conversion operations on the input signal. The first continuous-time stage outputs a first output signal. A second switched-capacitor stage receives the first output signal and performs switched-capacitor filtering of the first output signal. The second switched-capacitor stage outputs a continuous analog signal associated with the digital signal.

According to one aspect of the invention, there is provided a method of forming a digital to analog converter (DAC). The method includes providing a first continuous-time stage that receives an input signal associated with a digital signal and performs continuous-time digital-to-analog conversion operations on the input signal. The first continuous-time stage outputs a first output signal. Also, the method includes providing a second switched-capacitor stage receives the first output signal and performs switched-capacitor filtering of the first output signal. The second switched-capacitor stage outputs a continuous analog signal associated with the digital signal.

According to one aspect of the invention, there is provided a method of performing digital-to-analog conversion. The method includes receiving an input signal associated with a digital signal and performing continuous-time digital-to-analog conversion operations on the input signal. A first output signal is outputted. A switched-capacitor filtering is performed on the first output signal. Also, the method includes outputting a continuous analog signal associated with the digital signal.

BRIEF DESCRIPTION OF THE DRAWINGS

1B is a schematic diagram illustrating an alternative arrangement in which a digital delta-sigma single-bit digital bitstream is applied to a 1-bit DAC.

DETAILED DESCRIPTION OF THE INVENTION

The invention provides a novel approach in addressing difficulties associated with digital to analog conversion. The invention incorporates a continuous time filter arrangement with commonly known switched-capacitor architectures to aid in processing data received by digital modulators.

Figure 1A:
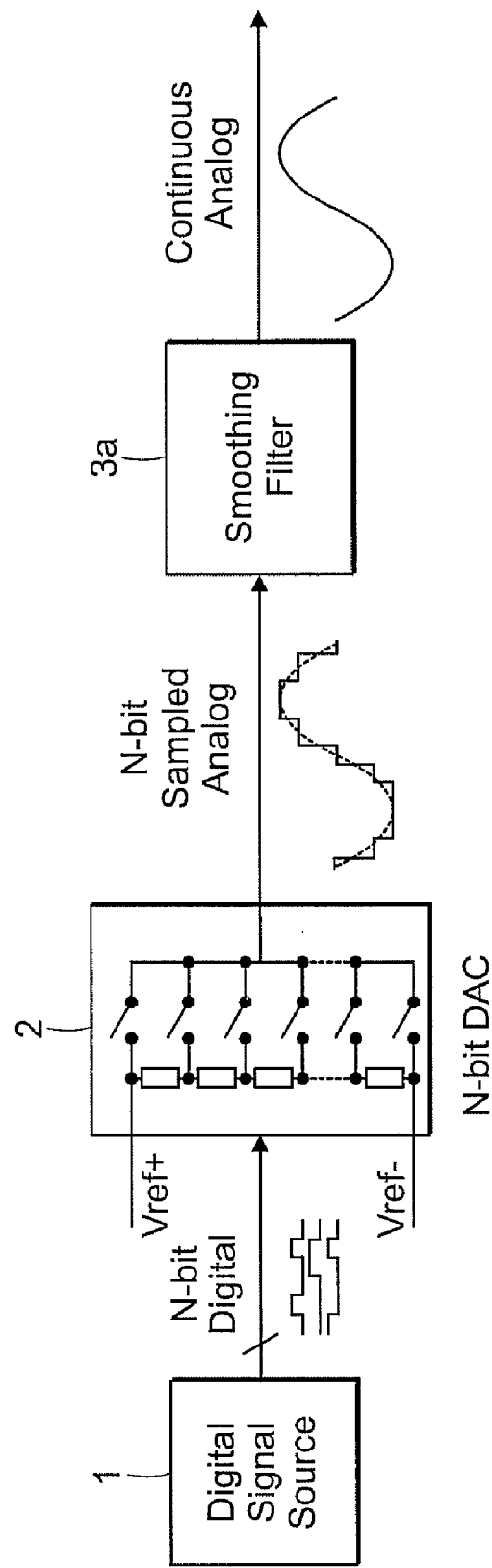
FIG. 1A is a schematic diagram illustrating a digital to analog converter arrangement in which a digital N-bit sampled signal (word) is input directly to an N-bit DAC; FIG.
Figure 1B:
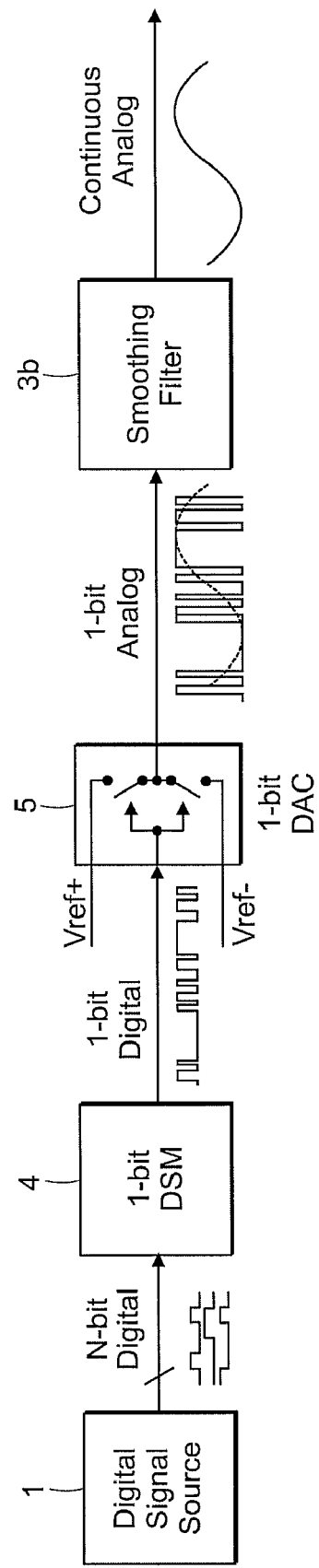
FIG. 1C is a schematic diagram illustrating a further alternative arrangement in which a multi-bit (n-bit) delta-sigma bit stream is applied to an n-bit DAC.
Figure 1C:
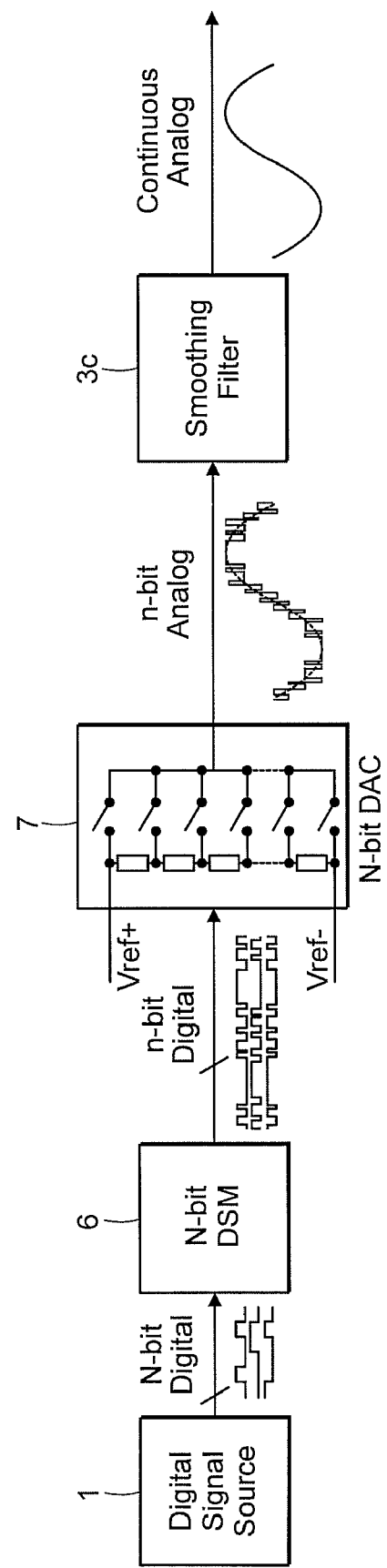
Figure 2:
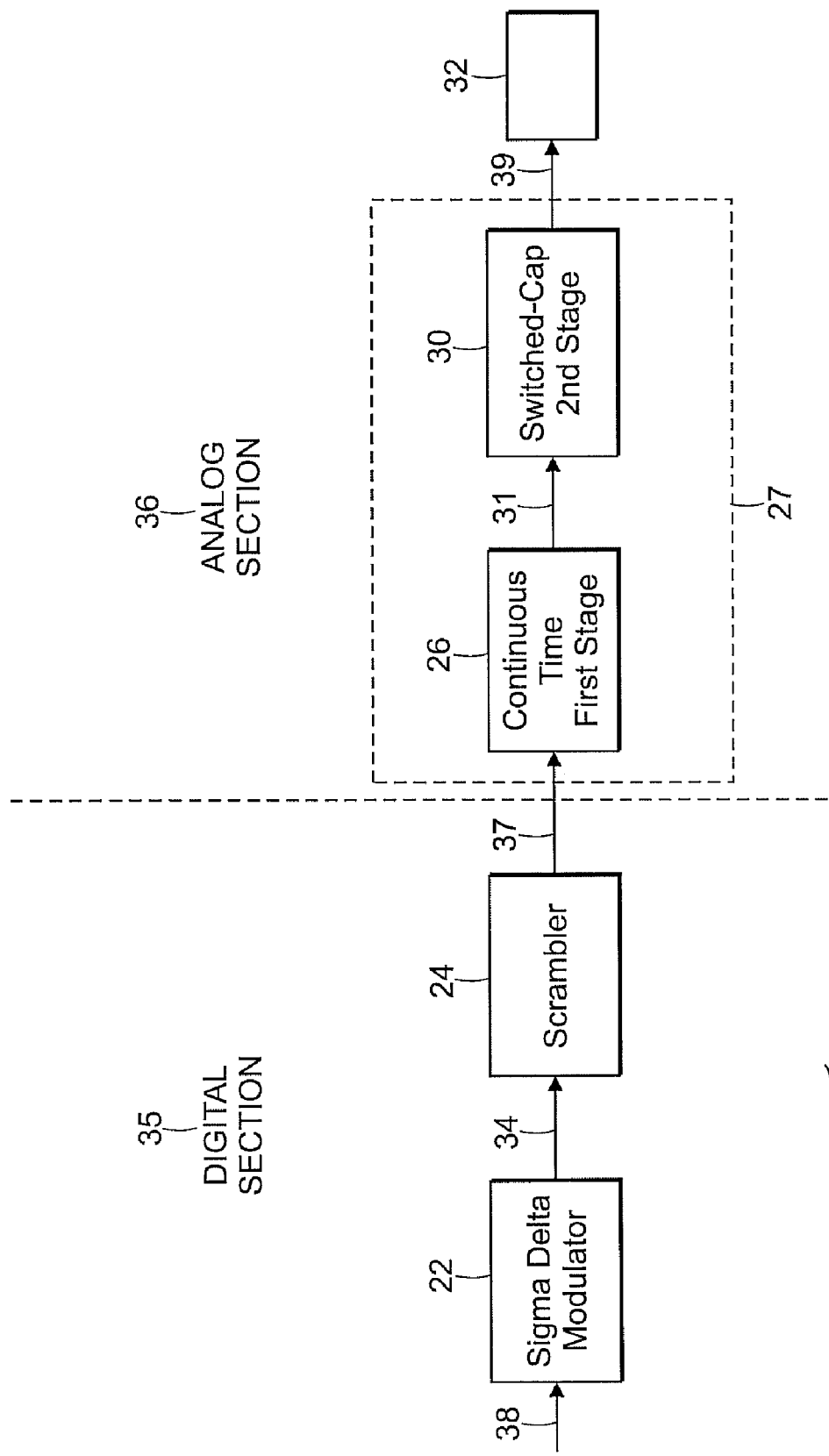
FIG. 2 is a flowchart overview of the digital-to-analog converter (DAC) used in accordance with the invention.

FIG. 2 is a flowchart overview of the digital-to-analog converter (DAC) 2 used in accordance with the invention. The DAC 20 includes two sides, a digital section 35 and an analog section 36, used in performing digital-to-analog conversion. On the digital section 35, a digital signal 38 is received by the DAC 20 thru a sigma-delta modulator 22. The sigma-delta modulator 22 takes the digital signal 38 having a lower-sample-rate wide-bit-width data and provides an output signal 34 having a high-sample-rate small-bit-width, usually but not necessarily shaping the spectrum of the resulting extra quantization noise so that it falls outside the signal band of interest. A scrambler 24 receives the output signal 34 and provides an output signal 37 associated with varying the selection of data units to achieve that level for a given value of the output signal 34. The scrambler 24 selects a different combination of data units on a pseudo-random basis to achieve the desired signal current to drive the analog side 36.

On the analog section 36, it includes a second order low pass filter arrangement 27 that comprises a first continuous time stage 26 and a second switched-capacitor stage 30. The first continuous time stage 26 receives the output signal 37 and performs filtering using continuous-time circuits commonly used in continuous-time sigma delta modulators. The first continuous time stage 26 then outputs an analog signal 31. Note such continuous-time architectures can achieve higher signal-to-noise performance in noisy mixed-signal chips, because they are less sensitive to transients and substrate noise. The second switched-capacitor stage 30 receives the output signal 31 and performs filtering operations typically performed by switched-capacitor circuits used in sigma delta DACs. The second switched-capacitor stage 30 outputs a continuous signal 39 to an output device 32.

The invention combines the first continuous time stage 26 with a second switched-capacitor stage 30. The first continuous time stage 26 achieves higher signal-to-noise performance than would be practical with an all-switched-capacitor design. An all-switched-capacitor architecture would be more sensitive to transients and substrate noise. This makes it difficult to improve their signal-to-noise ratio performance when they are used in a mixed signal chip that includes digital circuitry.The second switched-capacitor stage 30 adds additional low-pass filtering with less cost and area than the first continuous time stage 26.

Figure 3:
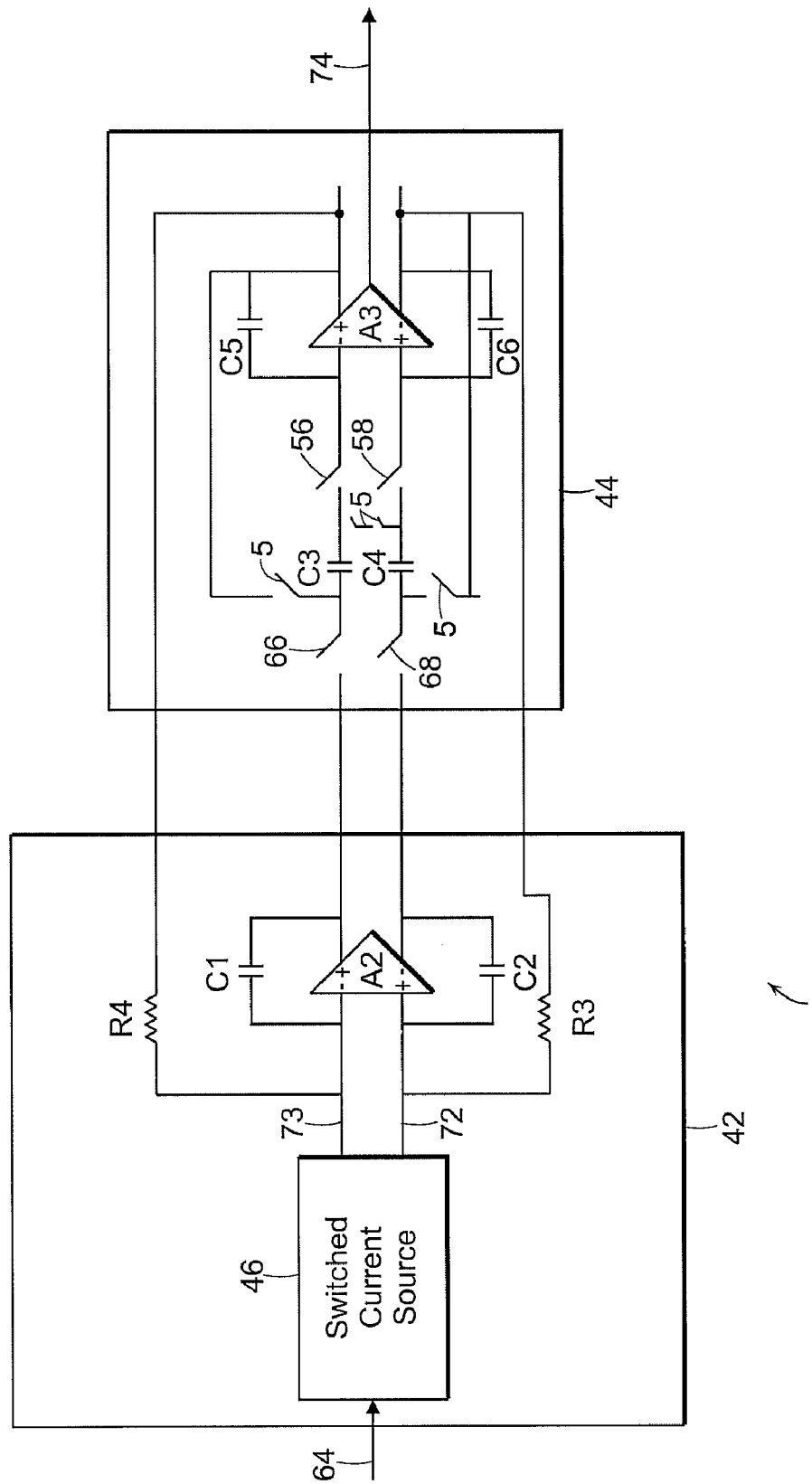
FIG. 3 shows is a schematic diagram illustrating the details of the inventive second order filter arrangement used in accordance with the invention.

FIG. 3 shows is a schematic diagram illustrating the details of the inventive second order filter arrangement used in accordance with the invention. The first continuous-time stage 42 includes a switched current source 46 used to drive the inverting and non-inverting input nodes of an amplifier A2. The switched current source 46 receives as input the signal 64 produced by a scrambler as described in FIG. 2 and provides two output signals 66 and 68. Based on the input signal 64 the switched current source 46 dictates the charging of the respective capacitors C1 and C2. Note output signal 66 is coupled to the inverting input node of the operational amplifier A2 and switch 68 is coupled to the non-inverting input node of the operational amplifier A2.

The capacitor C1 is coupled to both the inverting input node and the non-inverting output node of the operational amplifier A2. The resistor R4 is coupled to the inverting input node of the operational amplifier A2.

The capacitor C2 is coupled to both the non-inverting input node and the inverting output node of the operational amplifier A2. The resistor R3 is coupled to the non-inverting input node of the operational amplifier A2.

The second switched-capacitor stage 44 receives as input the inverting and non-inverting output nodes of operational amplifier A2. Switches 66 and 68 are coupled to the non-inverting and inverting output nodes of operational amplifier A2. A capacitor C3 is coupled to the switch 66 and a capacitor C4 is coupled to the switch 68. Note switches 66 and 68 are open or closed based in part by the signals they receive. Also, when the switches 66 and 68 are closed both capacitors C3 and C4 are charged accordingly until their respective switches 66 and 68 are opened and they discharge. However, the switches 66 and 68 are never simultaneously open or closed at the same time.

The capacitor C3 is coupled to the inverting input node of an operational amplifier A3 via switch 56. A charging capacitor C5 is coupled at both the inverting input node and the non-inverting output node of the operational amplifier A3. The other end of resistor R4 is coupled to the non-inverting output node of the operational amplifier A3.

The capacitor C4 is coupled to the inverting input node of an amplifier A3 via switch 58. A charging capacitor C6 is coupled at both the non-inverting input node and the inverting output node of the operational amplifier A3. The other end of resistor R3 is coupled to the inverting output node of the operational amplifier A3.

In charging the capacitors C5 and C6, a group of switches 5 are placed at various locations in the second switched-capacitor stage 44. These groups of switches 5 receive a clock signal CLK which dictates when these switches are opened and closed simultaneously.

Note the switches 5, 52, 54, 56, 58, 66, and 68 receive respective clock signals those determine when these respective switches will open or close.

The resistors R3 and R4 are also positioned to provide an RC filter arrangement at the first time-continuous stage 42 and aid in providing a stable continuous signal 74 as output by the operational amplifier A3.

The invention provides a novel approach in performing digital-to-analog conversion by introducing a two stage low pass filter arrangement having both continuous-time and switched-capacitor architectures. Moreover, the invention increases the signal-to-noise ratio performance that would be practical with an all-switched-capacitor design and provides an additional low-pass filtering with less cost and area than a conventional continuous-time design.

Although the present invention has been shown and described with respect to several preferred embodiments thereof, various changes, omissions and additions to the form and detail thereof, may be made therein, without departing from the spirit and scope of the invention.

What is claimed is:

1. A digital to analog converter comprising:
a first continuous-time stage that receives an input signal associated with a digital signal and performs continuous-time digital-to-analog conversion operations on said input signal, said first continuous-time stage outputs a first output signal;
a second switched-capacitor stage that receives said first output signal and performs switched-capacitor filtering on said first output signal, said second switched-capacitor stage outputs a continuous analog signal associated with said digital signal;
a digital modulator that receives said digital signal having a lower-sample-rate wide-bit-width data and provides a third output signal having a high-sample-rate small-bit-width; and
a scrambler that receives said third output signal and outputs a fourth output signal by selecting a different combination of data units on a pseudo-random basis to achieve the desired signal current to drive the first continuous-time stage.

2. The digital to analog converter of claim 1, wherein said first continuous-time stage and said second switched-capacitor stage comprise a second order low pass filter arrangement.

3. The digital to analog converter of claim 1, wherein said digital modulator comprises a sigma delta modulator.

4. The digital to analog converter of claim 1, wherein said first continuous stage comprises a plurality of RC filter arrangements.

5. The digital to analog converter of claim 4, wherein said first continuous stage comprises an operation amplifier to operate said RC filter arrangements.

6. The digital to analog converter of claim 1, wherein said second switched-capacitor stage comprises a circuit arrangement where a plurality of capacitors are arranged for charging and discharging their respective charges.

7. The digital to analog converter of claim 6, wherein said second switched-capacitor stage comprises an operation amplifier to aid in the charging and discharging of said capacitors.

8. A method of forming a digital to analog converter comprising:
providing a first continuous-time stage that receives an input signal associated with a digital signal and performs continuous-time digital-to-analog conversion operations on said input signal, said first continuous-time stage outputs a first output signal;
providing a second switched-capacitor stage that receives said first output signal and performs switched-capacitor filtering on said first output signal, said second switched-capacitor stage outputs a continuous analog signal associated with said digital signal
providing a digital modulator that receives said digital signal having a lower-sample rate wide-bit-width data and provides a third output signal having a high-sample-rate small-bit-width; and
providing a scrambler that receives said third output signal and outputs a fourth output signal by selecting a different combination of data units on a pseudo-random basis to achieve the desired signal current to drive the first continuous-time stage.

9. The method of claim 8, wherein said first continuous-time stage and said second switched-capacitor stage comprise a second order low pass filter arrangement.

10. The method of claim 8, wherein said digital modulator comprises a sigma delta modulator.

11. The method of claim 8, wherein said first continuous stage comprises a plurality of RC filter arrangements.

12. The method of claim 8, wherein said second switched-capacitor stage comprises a circuit arrangement where a plurality of capacitors are arranged for charging and discharging their respective charges.

13. The method of claim 11, wherein said first continuous stage comprises an operation amplifier to operate said RC filter arrangements.

14. The method of claim 13, wherein said second switched-capacitor stage comprises an operation amplifier to aid in the charging and discharging of said capacitors.

15. A method of performing digital to analog conversion comprising:
receiving a digital signal having a lower-sample-rate wide-bit-width data and provides a first output signal having a high-sample-rate small-bit-width;
receiving said first output signal and outputs a second output signal by selecting a different combination of data units on a pseudo-random basis to achieve the desired signal current;
performing continuous-time digital-to-analog conversion operations on said second output signal,
outputting a third output signal;
performing switched-capacitor filtering on said third output signal; and
outputting a continuous analog signal associated with said digital signal.

* * * * *